United States Patent
Kojima (10) Patent No.: US 11,336,289 B2
(45) Date of Patent: May 17, 2022

(54) CLOCK GENERATOR

(71) Applicants: Kabushiki Kaisha Toshiba, Tokyo (JP); Toshiba Electronic Devices & Storage Corporation, Tokyo (JP)

(72) Inventor: Hiroaki Kojima, Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/012,344

(22) Filed: Sep. 4, 2020

(65) Prior Publication Data

US 2021/0288654 A1 Sep. 16, 2021

(30) Foreign Application Priority Data

Mar. 13, 2020 (JP) .............................. JP2020-043934

(51) Int. Cl.
*H03L 7/099* (2006.01)
*H03L 7/24* (2006.01)
*H03L 7/18* (2006.01)

(52) U.S. Cl.
CPC .......... *H03L 7/0992* (2013.01); *H03L 7/1806* (2013.01); *H03L 7/24* (2013.01)

(58) Field of Classification Search
CPC ..... G06F 1/04; G06F 1/08; G06F 1/10; H03L 7/0992; H03L 7/1806; H03L 7/24; H03L 7/18; H03L 7/0805; H03L 7/07; H03L 7/0891; H03L 7/099; H03L 7/093; H03L 7/085; H03L 7/08; H03L 7/0812; H03L 7/0995; H03K 3/0321; H03K 5/135
See application file for complete search history.

(56) References Cited

U.S. PATENT DOCUMENTS

| | | | |
|---|---|---|---|
| 8,421,508 B2 | 4/2013 | Hirai et al. | |
| 9,479,113 B2 | 10/2016 | Yamamoto et al. | |
| 2006/0164174 A1* | 7/2006 | Molina | H03L 7/0891 331/16 |

FOREIGN PATENT DOCUMENTS

| | | |
|---|---|---|
| JP | 2012-165036 A | 8/2012 |
| JP | 5672092 B2 | 2/2015 |
| JP | 6371189 B2 | 8/2018 |

* cited by examiner

*Primary Examiner* — John W Poos
(74) *Attorney, Agent, or Firm* — Allen & Overy LLP (57) ABSTRACT

According to a clock generator, an oscillator outputs source oscillation clocks which are trimmed according to a trimming code. A first frequency divider generates X frequency division clocks by frequency-dividing the source oscillation clocks by a first frequency division ratio X. A trimming controller changes the trimming code within a period of the X frequency division clocks and supplies the changed trimming code to the oscillator.

7 Claims, 8 Drawing Sheets

CLOCK GENERATOR

CROSS-REFERENCE TO RELATED APPLICATIONS

This application is based upon and claims the benefit of priority from the prior Japanese Patent Application No. 2020-043934 filed in Japan on Mar. 13, 2020; the entire contents of which are incorporated herein by reference.

FIELD

Embodiments described herein relate to a clock generator which spreads a spectrum of clocks for reducing electromagnetic interference.

BACKGROUND

For example, in operating a switching element such as a DC-DC converter by supplying clocks at a frequency that takes a constant value with high accuracy, there is a case where a peak value of electromagnetic interference (EMI) becomes high. Particularly, when the DC-DC converter is used for large power, EMI affects other equipment. Accordingly, the peak value is lowered by spreading a frequency band of EMI by spreading a spectrum of supplied clocks.

Conventionally, there has been known a clock generator which spreads the spectrum of clocks by providing an analogue charge current adjustment circuit which adjusts a charge time by changing a current for charging a capacitor in plural stages in an oscillator for Obtaining source oscillation clocks according to a period in which two capacitors are alternately charged and discharged.

The analogue charge current adjustment circuit is constituted of an analogue element having a relatively large size and hence, a size of the oscillator is increased. Further, the number of analogue nodes in a test mode is increased, and it takes a long time for perforating a test with respect to all nodes at the time of shipping. Accordingly, it becomes necessary to choose between a mode where the test is performed with respect to all nodes although a test cost is increased and a mode where a test cost is kept low by reducing the number of nodes to which a test is performed although a defect detection ratio is lowered.

DETAILED DESCRIPTION

A clock generator according to an embodiment includes: an oscillator configured to output source oscillation clocks which are trimmed according to a trimming code; a first frequency divider configured to generate first frequency division clocks by frequency-dividing the source oscillation clocks by a first frequency division ratio; and a trimming controller configured to supply the trimming code to the oscillator by changing the trimming code within a period of the first frequency division clocks.

Hereinafter, an embodiment is described with reference to drawings.

Figure 1:
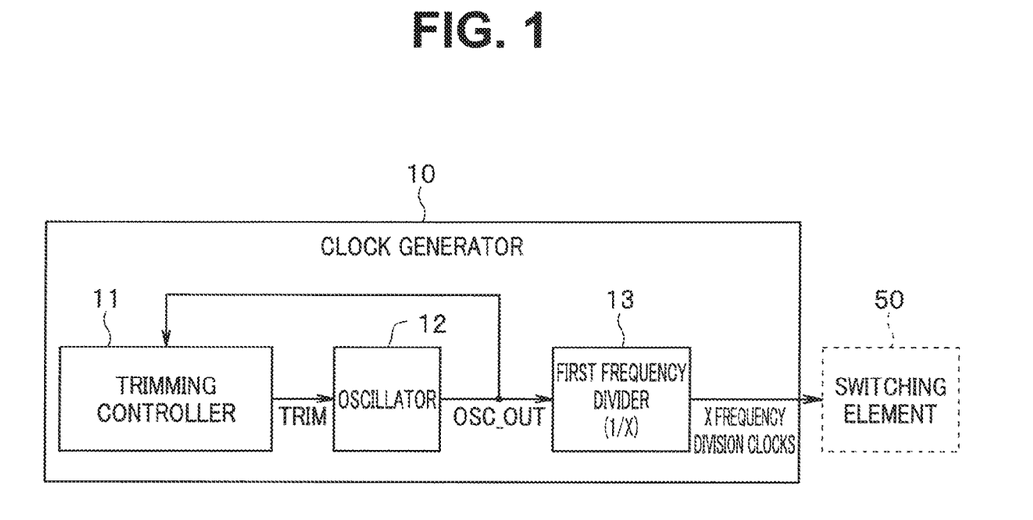
FIG. 1 is a block diagram showing a configuration of a clock generator according to a first embodiment.

First Embodiment (Configuration)
[Basic Configuration of Clock Generator 10]
FIG. 1 is a block diagram showing the configuration of a clock generator 10 according to the embodiment. The clock generator 10 includes a trimming controller 11, an oscillator 12, and a first frequency divider 13.

The oscillator 12 outputs source oscillation clocks OSC_OUT the frequency of which is adjusted according to a trimming code TRIM. The first frequency divider 13 frequency-divides the source oscillation clocks OSC_OUT at a first frequency division ratio X (X being a positive integer) thus generating an X frequency division clock (first frequency division clock). The X frequency division clocks are outputted to, for example, a switching element 50 disposed outside of the clock generator 10. The switching element 50 is, for example, a DC-DC converter.

The trimming controller 11 trims the source oscillation clocks OSC_OUT. The trimming controller 11 supplies a trimming code TRIM to the oscillator 12 by changing the trimming code TRIM within a period of the X frequency division clocks based on the source oscillation clocks OSC_OUT.

When the frequency of the X frequency division clocks takes a constant value with high accuracy, there is a case where a peak value of EMI becomes high. Particularly, when the DC-DC converter is used for large power, EMI affects other equipment. Accordingly, in this embodiment, the trimming code is changed within the period of the X frequency division clocks, and a charge time of a capacitor in the oscillator 12 is finely changed thus spreading a spectrum of the X frequency division clocks and reducing influence of EMI.

Figure 2:
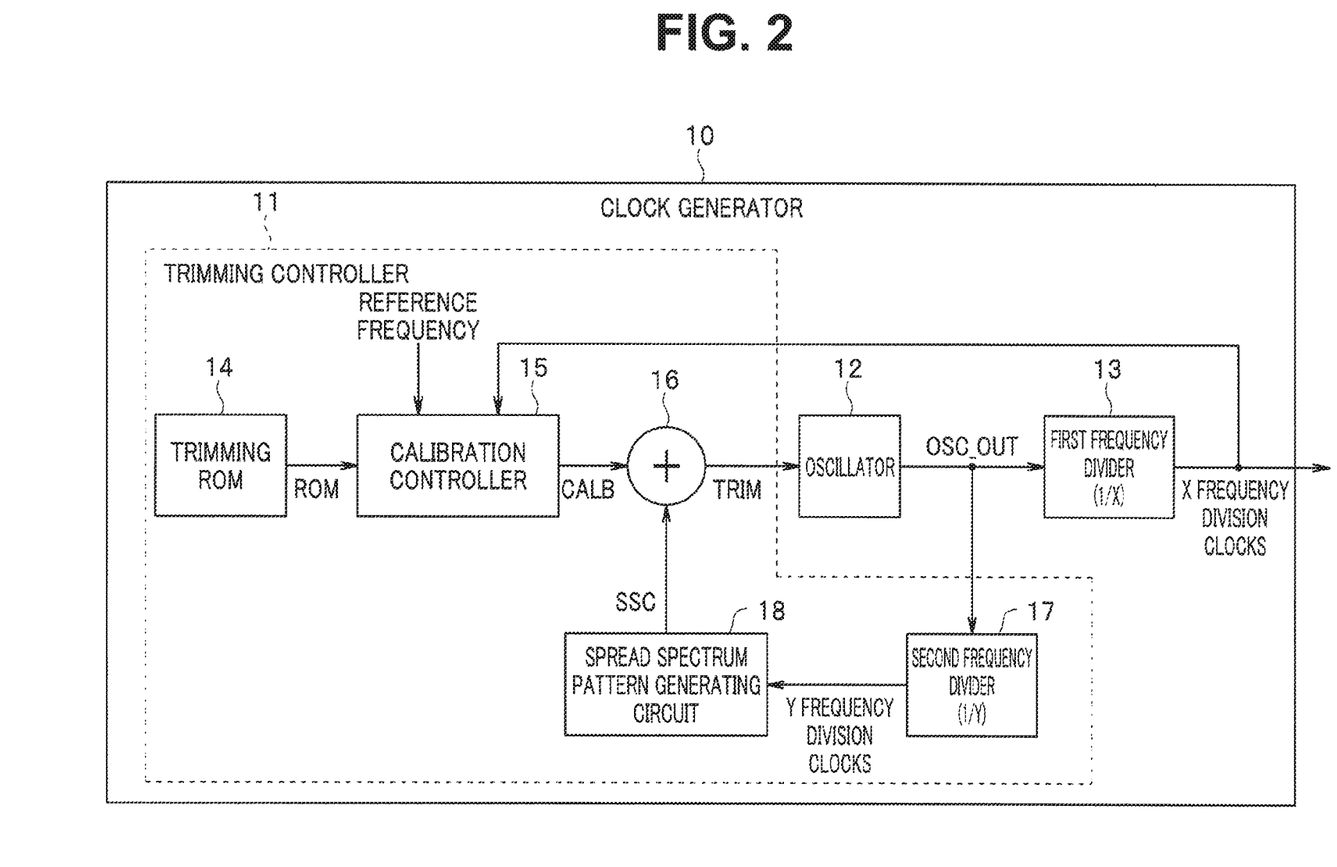
FIG. 2 is block diagram showing a configuration example of a trimming controller according to the first embodiment.

[More Detailed Configuration of Clock Generator 10]
FIG. 2 is a block diagram showing a configuration example of the trimming controller 11. The trimming controller 11 includes a trimming ROM 14, a calibration controller 15, an adding circuit 16, a second frequency divider 17, and a spread spectrum pattern generating circuit 18.

The trimming ROM 14 holds a basic trimming code ROM. The basic trimming code ROM is provided for correcting a frequency error in the oscillator 12 which occurs due to irregularities in manufacture.

The basic trimming code ROM is inputted to the calibration controller 15 from the trimming ROM 14, and the X frequency division clocks are inputted to the calibration controller 15 from the first frequency divider 13. The calibration controller 15 calculates a frequency drift of the X frequency division clocks based on a reference frequency. The calibration controller 15 corrects the basic trimming code ROM, and also generates a calibration code CALB which also corrects the frequency drift. The calibration performed by the calibration controller 15 is, for example, periodically performed at predetermined time intervals.

The second frequency divider 17 frequency-divides the source oscillation clocks OSC_OUT by a second frequency division ratio Y which differs from the first frequency division ratio X, and generates Y frequency division clocks (second frequency division clocks). The spread spectrum pattern generating circuit 18 generates a spread spectrum code SSC which is changed in synchronism with the Y frequency division clocks. The spread spectrum code SSC is changed in a periodic pattern having a predetermined spread amplitude and a predetermined spread period.

The adding circuit 16 adds the spread spectrum code SSC and the calibration code CALB together, generates a trimming code TRIM and outputs the trimming code TRIM to the oscillator 12. In other words, the adding circuit 16 changes the trimming code TRIM to a new trimming code TRIM during a period of the X frequency division clocks.

Figure 3:
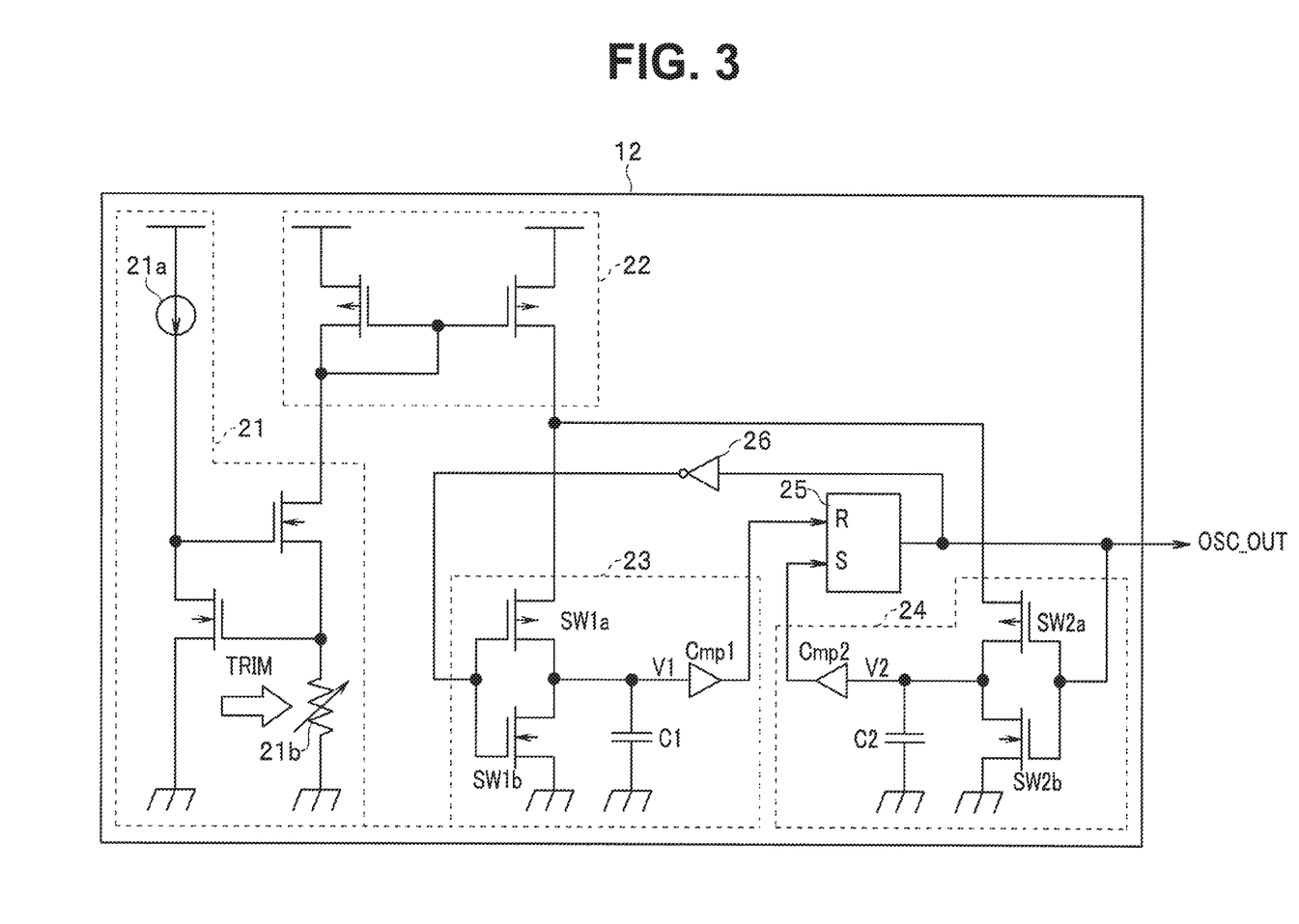
FIG. 3 is circuit diagram showing a configuration example of an oscillator according to the first embodiment.

FIG. 3 is a circuit diagram of a configuration example of the oscillator 12. The oscillator 12 includes a constant current circuit 21, a current-mirror circuit 22, a reset signal generating circuit 23, a set signal generating circuit 24, a logic gate 25 and an inverter 26. The oscillator 12 does not include an analogue charge current adjustment circuit for spreading a spectrum of the source oscillation clocks OSC_OUT, that is, an analogue circuit which adds a fine current adjusted in multiple stages to a constant current outputted from the current-mirror circuit 22.

The constant current circuit 21 includes a constant current source 21*a*, a variable resistor 21*b* and a plurality of NMOS transistors. The variable resistor 21*b* adjusts a current which flows through the constant current circuit 21 by changing a resistance value according to a trimming code TRIM.

The current-mirror circuit 22 includes a plurality of PMOS transistors. The current-mirror circuit 22 supplies a current proportional to a transistor size ratio (mirror ratio) of a current which flows through the constant current circuit 21 to the reset signal generating circuit 23 and the set signal generating circuit 24. The supply of a current from the current-mirror circuit 22 is performed by time division. Accordingly, a value of a current supplied to the reset signal generating circuit 23 and a value of a current supplied to the set signal generating circuit 24 are equal to each other.

The reset signal generating circuit 23 includes a charge switch SW1*a*, a capacitor C1, a discharge switch SW1*b* and a comparator Cmp1. The charge switch SW1*a* is formed of a PMOS transistor. When the charge switch SW1*a* is turned on, a current is supplied from the current-mirror circuit 22 to the capacitor C1. When the charge switch SW1*a* is turned off, the charge switch SW1*a* shuts off the supply of the current to the capacitor C1. The discharge switch SW1*b* is formed of an NMOS transistor. When the discharge switch SW1*b* is turned on, a charge stored in the capacitor C1 is discharged. When the discharge switch SW1*b* is turned off, discharging of the charge is stopped, in the capacitor C1, a voltage V1 which corresponds to a stored charge amount is changed by charging or discharging.

The comparator Cmp1 functions as a buffer which detects a voltage state of the capacitor C1. In other words, the comparator Cmp1 compares the voltage V1 of the capacitor C1 with a threshold voltage. When the voltage V1 of the capacitor C1 is below the threshold voltage, the comparator Cmp1 sets a reset signal at a low level and outputs the reset signal at a low level. When the voltage V1 of the capacitor C1 is equal to or above the threshold voltage, the comparator Cmp1 sets the reset signal at a high level and outputs the reset signal at a high level.

The set signal generating circuit 24 includes a charge switch SW2*a*, a capacitor C2, a discharge switch SW2*b* and a comparator Cmp2. The charge switch SW2*a* is formed of a PMOS transistor. When the charge switch SW2*a* is turned on, a current is supplied from the current-mirror circuit 22 to the capacitor C2. When the charge switch SW2*a* is turned off, the supply of a current to the capacitor C2 is shut off. The discharge switch SW2*b* is formed of an NMOS transistor. When the discharge switch SW2*b* is turned on, a charge stored in the capacitor C2 is discharged. When the discharge switch SW2*b* is turned off, discharging of the charge is stopped. In the capacitor C2, a voltage V2 which corresponds to a stored charge amount is changed by charging or discharging.

The comparator Cmp2 functions as a buffer which detects a voltage state of the capacitor C2. In other words, the comparator Cmp2 compares a voltage V2 of the capacitor C2 with a threshold voltage (equal to the threshold voltage with respect to the voltage V1). When the voltage V2 is below the threshold voltage, the comparator Cmp2 sets a set signal at a low level, and outputs the set signal at a low level. When the voltage V2 is equal to or above the threshold voltage, the comparator Cmp2 sets the set signal at a high level, and outputs the set signal at a high level.

The logic gate 25, when a reset signal is changed from a low level to a high level, sets a source oscillation clocks OSC_OUT at a low level and outputs the source oscillation clocks OSC_OUT at a low level. When a set signal is changed from a low level to a high level, the logic gate 25 sets the source oscillations clocks OSC_OUT at a high level and outputs the source oscillation clocks OSC_OUT at a high level.

The logic gate 25 outputs a source oscillation clocks OSC_OUT to the set signal generating circuit 24, and controls turning on/off of the charge switch SW2*a* and the discharge switch SW2*b*. The logic gate 25 outputs the source oscillation clocks OSC_OUT which are inverted by the inverter 26 to the reset signal generating circuit 23 and controls turning on/off of the charge switch SW1*a* and the discharge switch SW1*b*.

When the source oscillation clocks OSC_OUT are at a low level, the charge switch SW2*a* is turned on, and the discharge switch SW2*b* is turned off and hence, the capacitor C2 is charged. The charge switch SW1*a* is turned off and the discharge switch SW1*b* is turned on and hence, the capacitor C1 is discharged.

When the voltage V2 of the capacitor C2 becomes equal to or above a threshold voltage, a set signal becomes a high level, and the source oscillation clocks OSC_OUT become a high level. As a result, the charge switch SW2*a* is turned off and the discharge switch SW2*b* is turned on and hence, the capacitor C2 is discharged. The charge switch SW2*a* is turned on, and the discharge switch SW1*b* is turned off and hence, the capacitor C2 is charged.

When the voltage V2 of the capacitor C2 becomes equal to or above a threshold voltage, a reset signal becomes a high level, and the source oscillation clocks OSC_OUT become a low level. The capacitor C2 is charged, and the capacitor C1 is discharged.

By repeating such an operation, the source oscillation clocks OSC_OUT which are alternately switched between the low level and the high level are outputted from the oscillator 12.

A transition period (half period) between the low level and the high level is a period until the capacitors C1, C2 reach the threshold voltage or higher, and depends on a value of a current supplied from the current-mirror circuit 22, that is, when the current value is increased, a charge time for charging the capacitors C1, C2 is shortened and a frequency is increased. When the current value is decreased, the charge time for charging the capacitors C1, C2 are prolonged and the frequency is decreased.

The oscillator 12, by changing a resistance value of the variable resistor 21b according to a trimming code TRIM, adjusts a value of a current which flows through the constant current circuit 21, and adjusts a frequency of the source oscillation clocks OSC_OUT.

Figure 4:
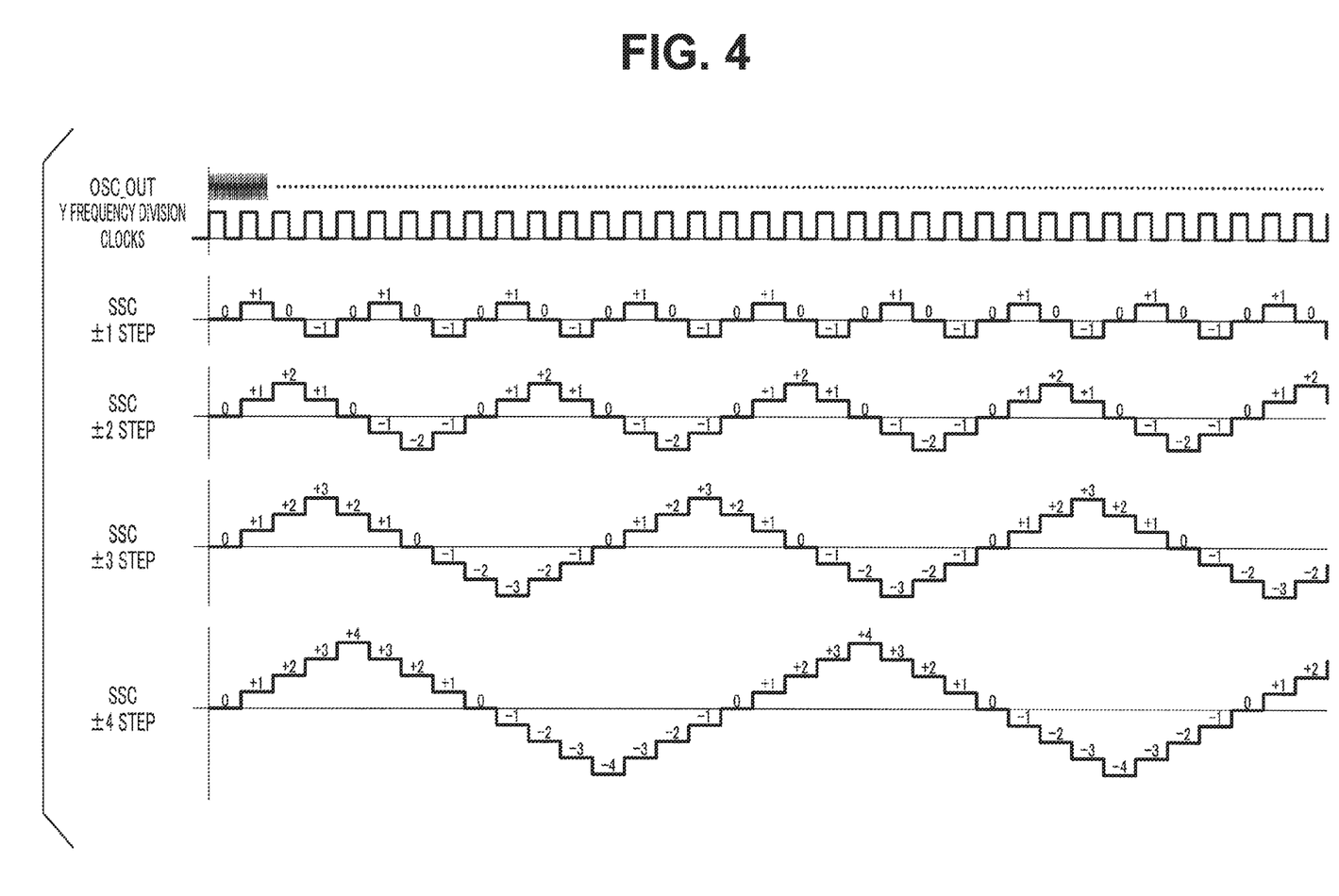
FIG. 4 is a timing chart showing examples of several patterns of a spread spectrum code according to the first embodiment.

FIG. 4 is a timing chart showing several pattern examples of a spread spectrum code according to the first embodiment. In FIG. 4, examples of a spread spectrum code SSC generated with spread amplitudes ranging from a ±1 step to a ±4 step are shown. For example, when the spread amplitude is the ±1 step, a pattern "0, +1, 0, −1" is repeated for every four periods of Y frequency division clocks. Among the ±1 step to the ±4 step shown in FIG. 4, the step suitable for the configuration of the switching element 50 is selected at the time of designing, and the selected step is set in the spread spectrum pattern generating circuit 18 as the spread spectrum code SSC, Spread periods during which the spread spectrum code SSC is repeated become the following multiples with respect to the periods of the Y frequency division clocks in the example shown in FIG. 4.

the pattern where the spread amplitude is the ±1 step: 4 periods the pattern where the spread amplitude is the ±2 step: 8 periods the pattern where the spread amplitude is the ±3 step: 12 periods the pattern where the spread amplitude is ±4 step: 16 periods The adding circuit 16 generates a trimming code TRIM by adding a spread spectrum code SSC to a calibration code CALB.

Figure 5:
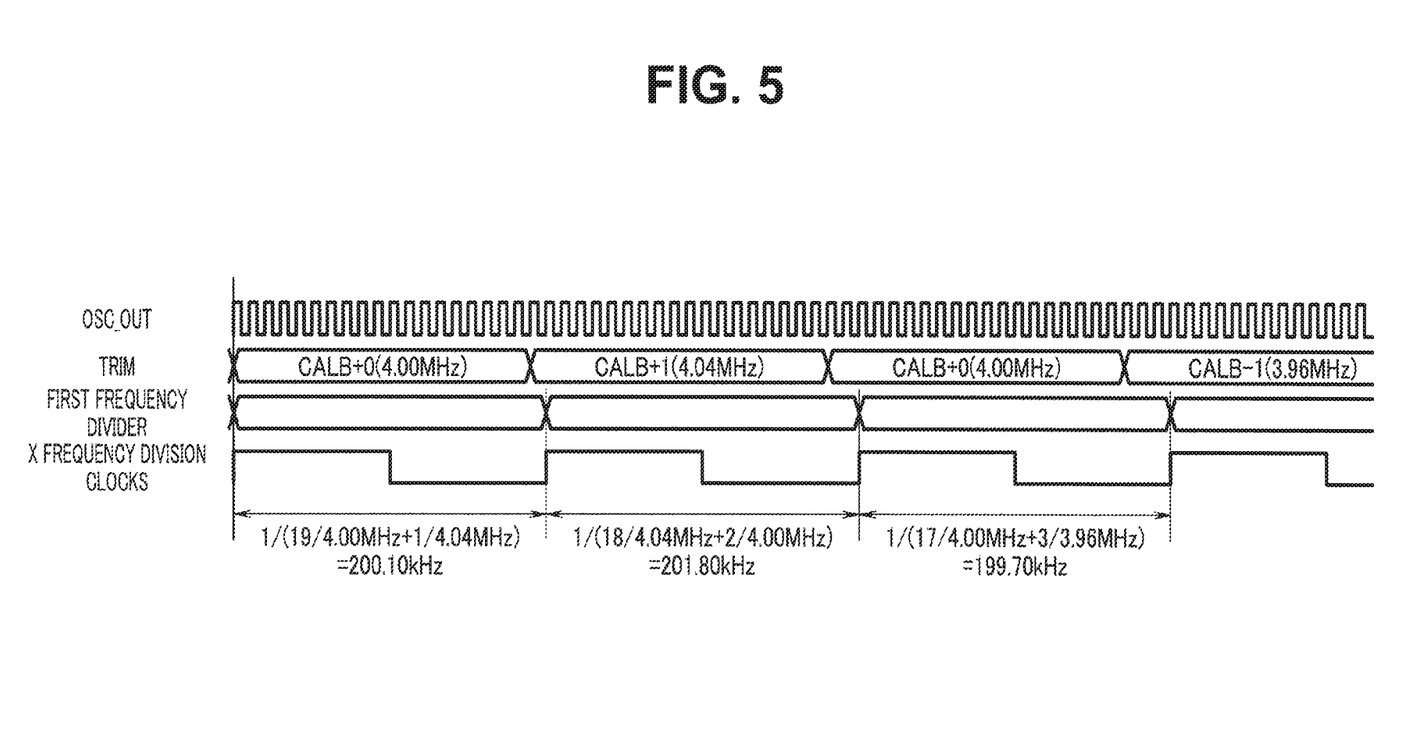
FIG. 5 is a timing chart showing source oscillation clocks, a trimming code and X frequency division clocks in the first embodiment.

FIG. 5 is a timing chart showing source oscillation clocks OSC_OUT, a trimming code TRIM and X frequency division clocks. In an example shown in FIG. 5, an average frequency of the source oscillation clocks OSC_OUT is 4 MHz, a first frequency division ratio X is 20, a second frequency division ratio Y is 19, and a frequency change amount of the source oscillation clocks OSC_OUT when the trimming code TRIM is changed by 1 step is 40 kHz.

The frequency change amount 40 kHz corresponds to trimming frequency resolution of the source oscillation clocks OSC_OUT, and is substantially equivalent to 1% of average frequency 4 MHz of the source oscillation clocks OSC_OUT. An average frequency of the source oscillation clocks OSC_OUT is 4 MHz, and X is 20 and hence, an average frequency of the X frequency division clocks becomes 200 kHz.

In the case where the spread amplitude is the ±1 step, three values can be taken as the spread spectrum code SSC. In other words, 0, +1, −1 can be taken as the spread spectrum code SSC. The spread spectrum code SSC sequentially takes values of 0, +1, 0, −1 each time a cycle amounting to 19 periods of the source oscillation clocks OSC_OUT (amounting to 1 period of the Y frequency division clocks) is switched.

The following three frequencies can be taken as the frequency of the source oscillation clocks OSC_OUT.

(4 MHz−0 kHz)=3.96 MHz
(4 MHz+0 kHz)=4.00 MHz
(4 MHz+40 kHz)=4.04 MHz

The following three frequency division clocks can be obtained by frequency-dividing these three source oscillation clocks OSC_OUT by 20.

3.96 MHz/20=1.98 kHz
4.00 MHz/20=200 kHz
4.04 MHz/20=202 kHz

On the other hand, according to the clock generator 10 of this embodiment, as shown in FIG. 5, the frequency of the source oscillation clocks OSC_OUT the first period of the X frequency division clocks becomes 4.00 MHz (19 frequency divisions) and 4.04 MHz (1 frequency division). Accordingly, the frequency of the X frequency division clocks becomes 200.1 kHz.

Accordingly, it is possible to obtain a frequency change amount of 0.1 kHz (=200.1 kHz−200 kHz) which is smaller than frequency resolution 2 kHz (=202 kHz−200 kHz) of the X frequency division clocks which corresponds to 1 step of the trimming code TRIM.

In the second period of the X frequency division clocks, the frequency of the source oscillation clocks OSC_OUT becomes 4.04 MHz (18 frequency divisions) and 4.00 MHz (2 frequency divisions). Frequency of the X frequency division clocks becomes 201.8 kHz, and a frequency change amount from the average frequency 200 kHz becomes 1.8 kHz.

In other words, in the example shown in FIG. 5, it is possible to obtain the X frequency division clocks which are spread in 19 frequencies within a range from 198.1 kHz to 201.9 kHz.

Figure 6:
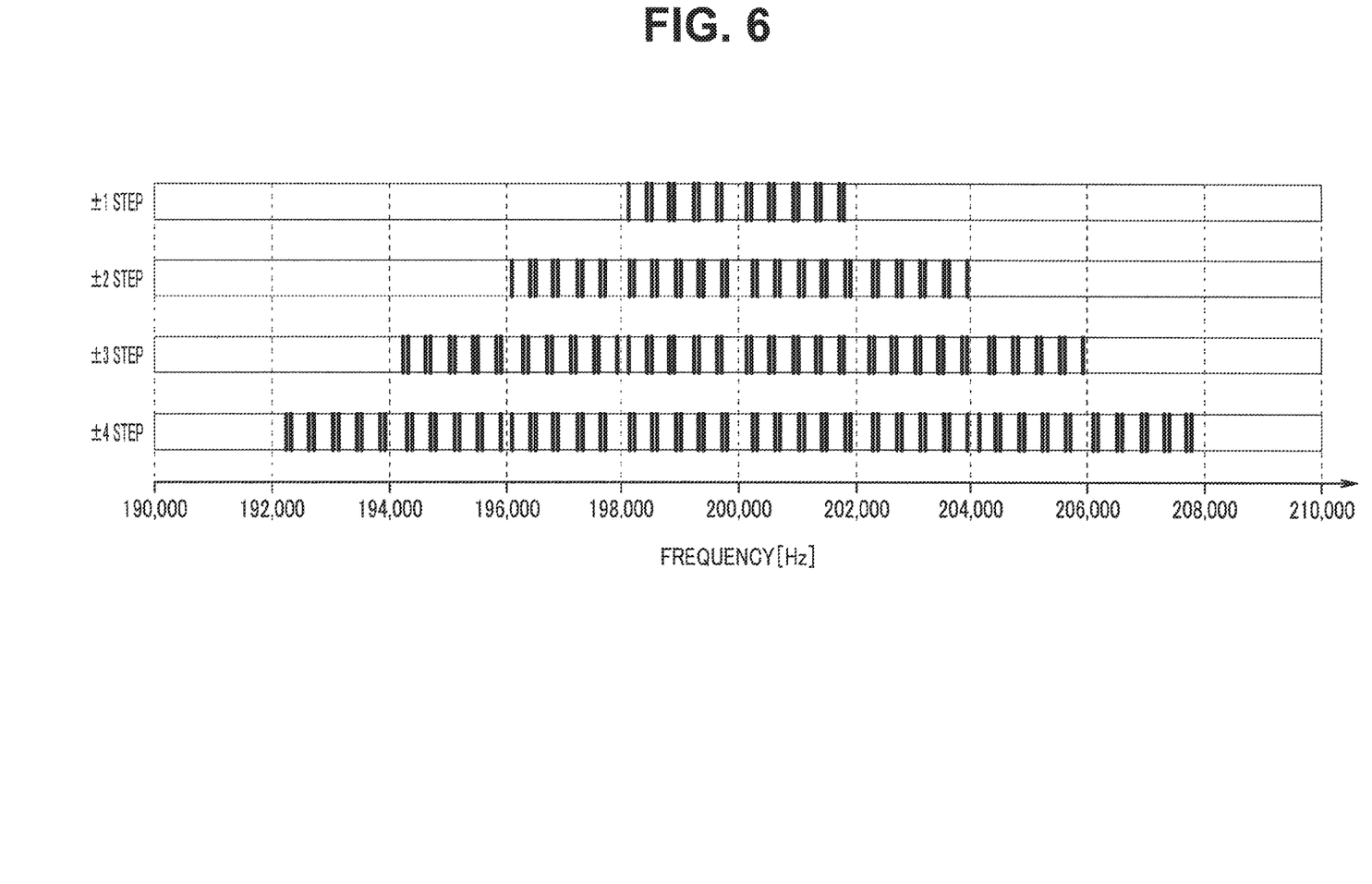
FIG. 6 is a view showing frequency distribution of X frequency division clocks obtained when the spread spectrum code is changed in the patterns shown in FIG. 4.

FIG. 6 is a view showing the frequency distribution of the X frequency division docks obtained when the spread spectrum code SSC is changed in accordance with the patterns shown in FIG. 4.

In an example shown in FIG. 6, the number of frequency positions where the X frequency division clocks spread becomes as follows.

the pattern where the spread amplitude is the ±1 step: 19
the pattern where the spread amplitude is the ±2 step: 38
the pattern where the spread amplitude is the ±3 step: 57
the pattern where the spread amplitude is the ±4 step: 76

As shown in FIG. 6, the frequency positions where the X frequency division clocks spread are substantially uniformly distributed in the frequency direction within a predetermined frequency range corresponding to the spread amplitude except for that the local uneven distribution where the number of cases where two frequency positions are disposed close to each other is large. The appearance frequencies of the respective frequency positions differ according to the respective frequency positions in general.

The larger the spread amplitude, the wider the frequency range in which the X frequency division clocks spread becomes. However, it is not desirable that the frequency range becomes excessively wide. Accordingly, the spread amplitude may be set such that a frequency range suitable for the switching element 50 which is an output destination can be obtained.

When the spread amplitude is the ±1 step, the frequency of 19 X frequency division clocks can be obtained from the frequency of 3 source oscillation clocks OSC_OUT. This is because the second frequency division ratio Y for generating a period of the spread spectrum code SSC (that is, a period for switching the frequency of the source oscillation clocks OSC_OUT) and the first frequency division ratio X for generating the X frequency division clocks are properly set.

In this embodiment, in addition to the spread amplitude, the frequency division ratios X, Y can also be properly set.

As a specific example, the second frequency divider 17 may set an integer where a least common multiple of X and Y becomes maximum within a range from (X−α) to (X+β) inclusive as Y. α and β are integers which are less than X and equal to or greater than 0, and at least one of α and β is a positive integer. As an example which satisfies this condition, a case is named where the value of Y does not largely differ from the value of X, and both X and Y are prime numbers.

For example, in the case where X=20, α=3, β=0, an integer where a least common multiple with 20 becomes maximum within a range of 17 to 20 inclusive is set as Y. In this case, the least common multiple becomes maximum when X=20, and Y=19. Accordingly, it is understood that setting Y=19 with respect to X=20 is appropriate within a predetermined range.

The clock generator 10 may be configured of a one-chip integrated circuit or a part of a larger-scale integrated circuit. In this case, with respect to at least one of the first frequency division ratio X, the second frequency division ratio Y, and the spread amplitude and the spread period of the spread spectrum code SSC, a plurality of values which can be set may be prepared in advance. With such configuration, the same clock generator 10 can be combined with various types of switching elements 50.

In the first embodiment, within the period of the X frequency division clocks which the first frequency divider 13 generates, the trimming code TRIM is changed and is supplied to the oscillator 12 and hence, the source oscillation clocks OSC_OUT are trimmed and the frequency is changed within the period of the X frequency division clocks. Accordingly, it is possible to obtain frequency division clocks with a frequency change amount smaller than the frequency resolution of the X frequency division clocks which correspond to one step of the trimming code TRIM.

It is sufficient for the oscillator 12 of this embodiment to possess, as the configuration for spreading a spectrum, a trimming function for correcting a frequency error caused by irregularities in manufacture. It is unnecessary for the oscillator 12 to include an analogue charge current adjustment circuit which adds a fine current adjusted in multiple stages to a constant current. Since the analogue charge current adjustment circuit which is formed of an analogue element having a relatively large size is unnecessary, downsizing of the clock generator 10 including the oscillator 12 can be realized.

Analogue nodes for performing a test of an analogue charge current adjustment circuit are also unnecessary and hence, downsizing of the clock generator 10 by an amount corresponding to the analogue nodes can also be realized. Further, a test step which requires a long time for testing all analogue nodes becomes unnecessary.

The clock generator 10 according to this embodiment is mountable by a logic (logic circuit) except the oscillator 12. As a logic for spreading a spectrum, a shipping test method having high defect detection ratio such as a scanning test is applicable and hence, a test cost can be kept low.

A trimming code TRIM is generated in synchronism with Y frequency division clocks obtained by frequency-dividing the source oscillation clocks OSC_OUT by the second frequency division ratio Y which differs from the first frequency division ratio X, and the trimming code TRIM is supplied to the oscillator 12. In other words, by properly setting X and Y, the X frequency division clocks spread substantially uniformly in the frequency direction can be obtained and hence, frequency can be spread with higher efficiency.

By periodically changing the spread spectrum code SSC with a predetermined spread amplitude and a predetermined spread period, the X frequency division clocks spread at a relatively large number of frequency positions can be obtained by the spread spectrum pattern generating circuit 18 having the simple configuration.

In this manner, without requiring an analogue charge current adjustment circuit, a spectrum of the X frequency division clocks supplied to the switching element 50 can be spread and hence, a peak value of EMI which is generated from the switching element 50 can be effectively lowered.

Second Embodiment

In the second embodiment, with respect to parts which are substantially identical with the corresponding parts in the first embodiment, the description of these parts is suitably omitted by giving the substantially same symbols or the like, and the description is made mainly with respect to points which make the second embodiment differ from the first embodiment. The configuration of the clock generator 10 according to this embodiment is substantially equal to the configuration of the clock generator 10 according to the first embodiment. However, the second embodiment differs from the first embodiment with respect to patterns of a spread spectrum code SSC generated from a spread spectrum pattern generating circuit 18.

Figure 7:
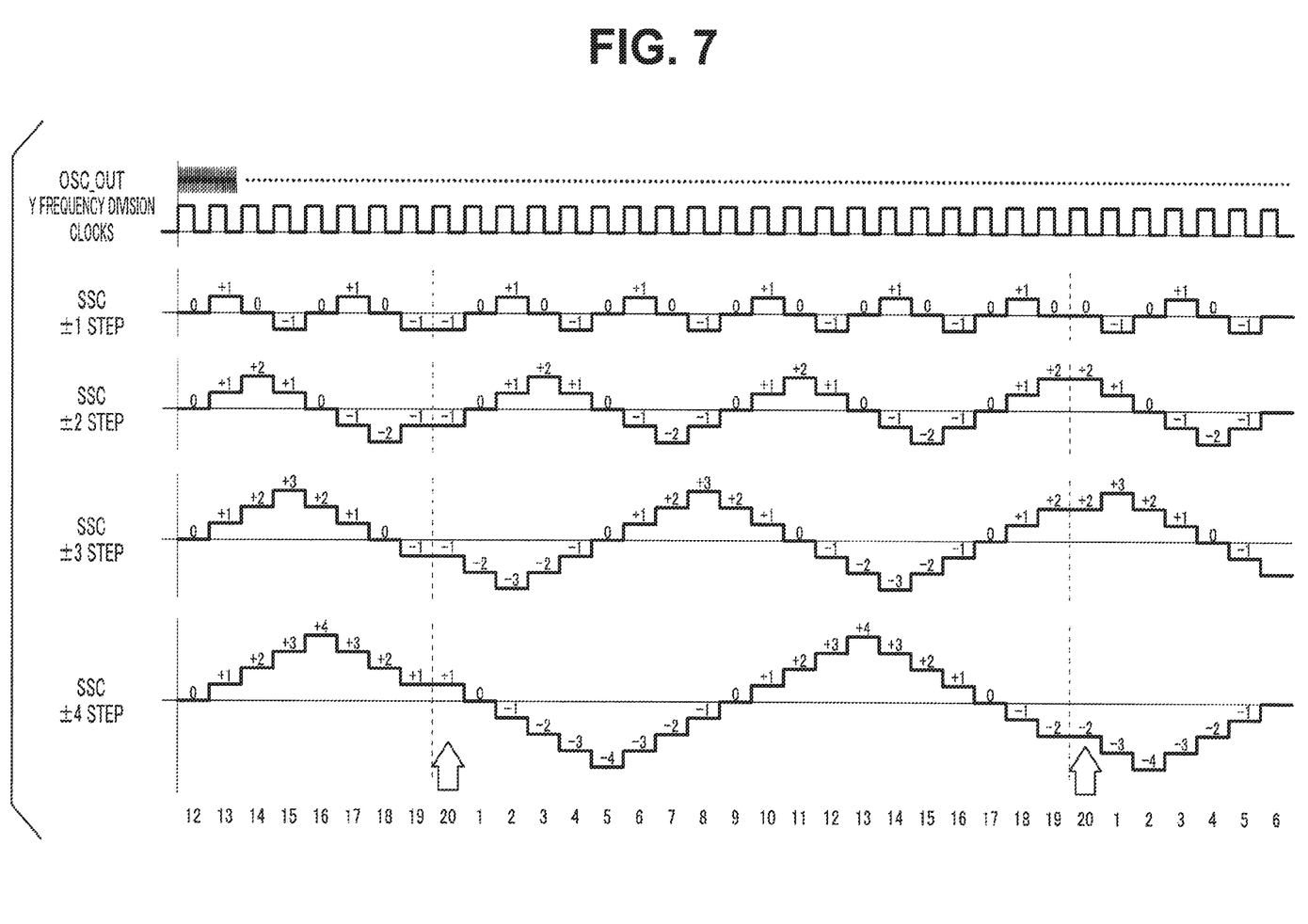
FIG. 7 is a timing chart showing several examples of a spread spectrum code according to a second embodiment.

FIG. 7 is a timing chart showing several pattern examples of a spread spectrum code according to the second embodiment. In FIG. 7, average frequency of source oscillation clocks OSC_OUT is 4 MHz, a first frequency division ratio X is 20, a second frequency division ratio Y is 19, and a frequency change amount of the source oscillation clocks OSC_OUT when a trimming code TRIM is changed by 1 step is 40 kHz. The spread spectrum code shown in FIG. 7 is changed in a pattern where a discontinuous portion is periodically given to periodicity where the spread spectrum code is changed at a predetermined spread amplitude and a predetermined spread period.

In the example shown in FIG. 7, when the spread spectrum code SSC is switched for every 20 times, the immediately-before (19th time) spread spectrum code SSC is continuously outputted. In other words, FIG. 7 shows the example where discontinuous portions are given to the basic spread spectrum code.

In this example, the relationship between Z and X is set to Z=X=20, it is unnecessary to set the relationship to Z=X, and the relationship may be set to Z≠X. Further, in the example shown in FIG. 7, Z is set without correlating with a spread amplitude. However, Z may take different values according to spread amplitudes.

Figure 8:
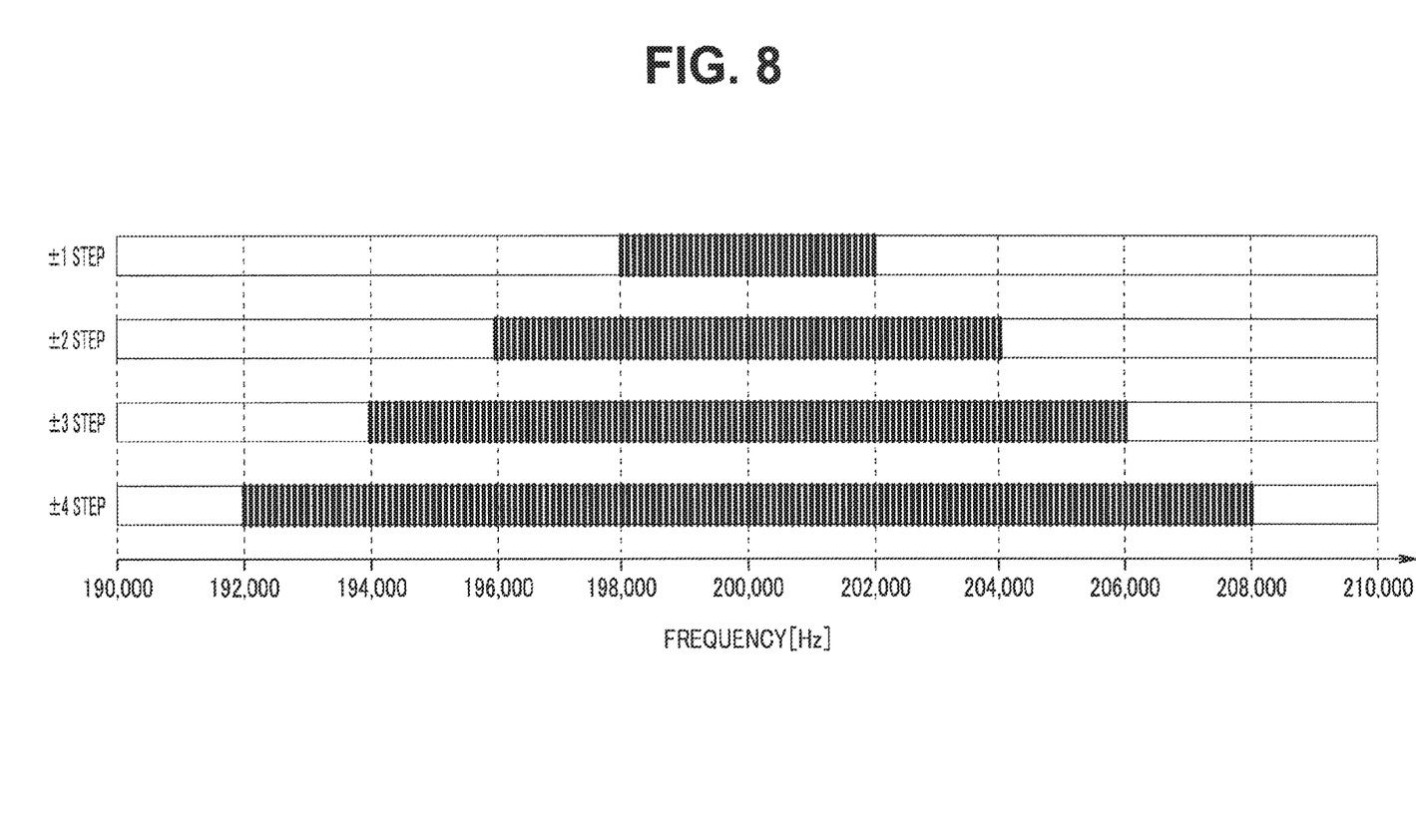
FIG. 8 is a view showing the frequency distribution of X frequency division clocks obtained when the spread spectrum code is changed in patterns shown in FIG. 7.

FIG. 8 is a view showing the frequency distribution of X frequency division clocks obtained when the spread spectrum code SSC is changed in accordance the patterns shown in FIG. 7.

In the example shown in FIG. 8, the number of frequency positions to which the X frequency division clocks spread is as follows.

the pattern in which spread amplitude is the ±1 step: 41
the pattern in which spread amplitude is the ±2 step: 81
the pattern in which spread amplitude is the ±3 step: 121
the pattern in which spread amplitude is the ±4 step: 161

As shown in FIG. 8, the number of frequency positions to which the X frequency division clocks spread is increased twice or more compared to the number of corresponding frequency positions in the first embodiment. Further, the local uneven distribution such as a case where two frequency positions are disposed close to each other as shown in FIG. 6 is eliminated. In other words, the frequency positions of the X frequency division clocks shown in FIG. 8 are substantially uniformly distributed at finer frequency intervals than the corresponding frequency positions in the first embodiment in the frequency direction within a predetermined frequency range according to a spread amplitude.

According to the second embodiment, it is possible to acquire substantially the same advantageous effects as the first embodiment. Further, a discontinuous portion is periodically set in periodicity where the spread spectrum code SSC is changed. Accordingly, the number of spread frequency positions can be increased and hence, the X frequency division clocks can be spread at finer frequency intervals, In the configuration shown in FIG. 2, the clock generator 10 includes the calibration controller 15. In performing the spread spectrum in the respective embodiments, the calibration controller 15 may be omitted. In this case, it is sufficient for the adding circuit 16 to supply a trimming code TRIM, which is a result of adding a spread spectrum code SSC and a basic trimming code ROM, to the oscillator 12.

In the case where the clock generator 10 includes the calibration controller 15, when calibration of the basic trimming code by the calibration controller 15 and the generation of the spread spectrum code. SSC by the spread spectrum pattern generating circuit 18 are performed simultaneously, there is a concern that a calibration result is not correct. Accordingly, it is preferable to perform a control of stopping the generation of the spread spectrum code SSC during a period where the calibration is performed.

FIG. 4 shows the example where the spread spectrum code is changed in the patterns fitted to a triangular waveform. However, the present invention is not limited to such an example. The spread spectrum code may be changed in patterns fitted to a sinusoidal waveform, a sawtooth waveform or other desired waveforms. Accordingly, it is possible to perform a spread spectrum which is optimized to the switching element 50 having more diverse characteristics.

The spread spectrum code is not limited to a case where the spread spectrum code is changed in patterns fitted to a specific waveform. The spread spectrum code SSC may be changed at random within a predetermined spread amplitude range. Accordingly, it is possible to obtain the X frequency division clocks where the number of spread frequency positions is large and hence, the X frequency division clocks are spread at finer frequency intervals.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. A clock generator comprising:
an oscillator configured to output source oscillation clocks which are trimmed according to a trimming code;
a first frequency divider configured to generate first frequency division clocks by frequency-dividing the source oscillation clocks by a first frequency division ratio; and
a trimming controller configured to supply the trimming code to the oscillator by changing the trimming code within a period of the first frequency division clocks, wherein the trimming controller comprises:
a second frequency divider configured to generate second frequency division clocks by frequency-dividing the source oscillation clocks by a second frequency division ratio which differs from the first frequency division ratio,
a spread spectrum pattern generating circuit configured to generate a spread spectrum code which is changed in synchronism with the second frequency division clocks, and
an adding circuit configured to change the trimming code by adding the spread spectrum code generated in synchronism with the second frequency division clocks to a basic trimming code, and to supply the trimming code to the oscillator.

2. The clock generator according to claim 1, wherein
in a case where the first frequency division ratio is expressed as X, the second frequency division ratio is expressed as Y using different positive integers X and Y, assuming that α and β are integers which are less than X and equal to or greater than 0 and at least one of α and β is a positive integer,
the second frequency divider is configured to set an integer where a least common multiple of X and Y becomes maximum within a range from (X−α) to (X+β) inclusive as Y.

3. The clock generator according to claim 1, wherein with respect to at least one of the first frequency division ratio, the second frequency division ratio, a spread amplitude of the spread spectrum code and a spread period of the spread spectrum code, a plurality of values which can be set are prepared in advance.

4. The clock generator according to claim 1, wherein the spread spectrum code is changed in a periodic pattern having a predetermined spread amplitude and a predetermined spread period.

5. The clock generator according to claim 4, wherein the spread spectrum code is changed in a pattern fitted to a triangular waveform, a sinusoidal waveform or a sawtooth waveform.

6. The clock generator according to claim 1 wherein the spread spectrum code is changed in a pattern where a discontinuous portion is periodically given to periodicity of a pattern where the spread spectrum code is periodically changed at a predetermined spread amplitude and a predetermined spread period.

7. The clock generator according to claim 1, wherein the spread spectrum code is changed at random within a predetermined spread amplitude range.

* * * * *